United States Patent [19]

Korb

[11] Patent Number: 4,752,335
[45] Date of Patent: Jun. 21, 1988

[54] PROCESS FOR THE MANUFACTURE OF A TARGET FOR CATHODIC SPUTTERING

[75] Inventor: Georg Korb, Muhl/Reutte, Austria

[73] Assignee: Schwarzkopf Development Corporation, New York, N.Y.

[21] Appl. No.: 44,443

[22] Filed: Apr. 30, 1987

[30] Foreign Application Priority Data

Apr. 30, 1986 [AT] Austria ................................. 1162/86

[51] Int. Cl.$^4$ ................................................ B22F 3/00
[52] U.S. Cl. ........................................ 75/249; 419/10; 419/66; 419/68; 204/292; 204/293
[58] Field of Search ............... 419/10, 66, 68; 75/149; 204/292, 293

[56] References Cited

U.S. PATENT DOCUMENTS

| 2,830,108 | 4/1958 | Peters | 419/66 |
| 4,038,216 | 7/1977 | Henrich et al. | 419/19 |
| 4,526,747 | 7/1985 | Schimmel et al. | 419/68 |
| 4,619,697 | 10/1986 | Hijikata et al. | 419/66 |

FOREIGN PATENT DOCUMENTS

| 2426922 | 1/1975 | Fed. Rep. of Germany . |
| 2940369 | 5/1981 | Fed. Rep. of Germany . |
| 3149910 | 6/1983 | Fed. Rep. of Germany . |

Primary Examiner—Stephen J. Lechert, Jr.
Attorney, Agent, or Firm—Morgan & Finnegan

[57] ABSTRACT

A process for forming a metallic sputter target and a metallic sputter target product are provided. The process provides a dense homogenious bulk material of high strength comprising ductile metal components which forms a brittle composition when alloying. The process employs a mixture of individual components at least one of which being ductile at room temperatures. The individual components can be all metals, or a mixture of metals and non-metals. The individual components are formed into a powder mixture in a first step. Unlike hot pressing or other melting techniques which can cause ductile components to alloy into brittle materials, the powder mixture is cold pressed to form a shaped body which is thereafter densified by repeated working at temperatures below the lowest of the melting points of the individual components. This treatment occurs under conditions of material flow and cold welding. The resultant product is a dense target wherein the individual components continue to exist as a mixture of powders. The sputter target of the invention has the density and mechanical strength required of commercial sputter targets. The target product is machinable.

9 Claims, No Drawings

PROCESS FOR THE MANUFACTURE OF A TARGET FOR CATHODIC SPUTTERING

FIELD OF THE INVENTION

The present invention relates to a process for manufacturing a target for cathodic sputtering and the resulting target. More particularly, the present invention relates to a multicomponent metallic target for cathodic sputtering having more than one component and which is not a homogeneous alloy, and wherein at least one component of the target is ductile at cold or relatively cold temperatures, i.e., room temperatures. Advantageously the target of the invention can be manufactured from materials that would form brittle alloys and/or exhibit brittle intermetallic phases if processed at high temperatures.

BACKGROUND OF THE INVENTION

In recent years, there has been a major upswing in the use of cathodic sputtering as a coating technique. Sputtering processes have become increasingly diversified and intrinsically more refined. The use of sputtering-dependent coating techniques ranging from the production of wear-resistant and/or corrosion-resistant surface bodies, layer by layer, is a particularly common practice in the electronics industry. Such targets are subject to wide and varied requirements, not only as to the composition, but also as to the shape and physical condition of the resultant target.

Although for a long time only individual metals and commonly-used metal alloys were employed as target materials, recently there has been a demand for targets which permit several metals to be sputtered at the same time, typically in closely-toleranced mixture ratios and at high degrees of purity, even if the different metals used are incapable of or unsuitable for alloying, or if both metallic and non-metallic components are involved. Metals or metal/non-metal compounds which are generally considered incapable or unsuitable for alloying include, among others, individual components which are mutually immiscible in the liquid phase, and/or which cannot be induced to solidify homogeneously from the metal due, in part, to dissimilar densities.

Brittle intermetallic phases often occur in many alloy systems presently desired for use as sputter targets. Solid bodies of these compositions are neither workable (either by cold-working or hot-working) nor machinable by conventional chip-forming methods, except possibly at great expense and effort. Cathodic sputtering units currently in use are also of many different designs. These designs call for targets of many specific and different shapes which are often geometrically very complex. As a rule, these shapes are only producible by conventional machining from blanks. For conductivity and stability reasons sputter targets frequently have to be mounted on supporting materials, typically with screws. This calls for the provision of additional holes in the target which are, at best, difficult to form in brittle materials.

Target breakage is often the cause of work stoppage when coating units are operated industrially. Even the act of fixing a screw in a marginally ductile target to attach it to a supporting material sometimes causes immediate breakage. This is because, in part, the screw must be fastened very tightly to insure intimate contact and good thermal and electrical conductivity in the contact area. Temperature differences between the base cathode and the target can also lead to additional mechanical stresses in the target. This is also a common cause of breakage due to stresses created by non-uniform heating of the target because of local variations in the intensity of ion bombardment during operation.

The requirement for a high density or, rather, a high degree of freedom from porosity renders target manufacture more difficult, and has precluded the use of many metallurgical and powder-metallurgical techniques.

German Pat. Document No. DE A1 24 26 922 gives an overview of the many difficulties that can arise in the "manufacture of solid, homogeneous workpieces from constitutionally complex alloys". As described in that patent, workpieces composed of complex alloys including, for example, targets, are often produced by hot-pressing homogeneous powder mixtures composed of the individual alloy components. This technique involves compacting the components under multi-directional pressure conditions, particularly at isostatic conditions, and is generally accompanied by fusion of the component having the lowest melting point, and the formation of bodies having rather simple geometric target shapes. If a suitable alloy forms brittle intermetallic phases, hot-pressed shaped bodies therefrom will be brittle as well, and will only be able to withstand light mechanical stresses, making the use of these materials unsuitable for cathodic sputtering targets. Moreover, when the hot-pressing manufacturing technique is used, it is impossible or nearly impossible in many cases to achieve the degree of freedom from porosity desired for target materials.

German Pat. Nos. DE A1 31 49 910 and DE C2 29 40 369 describe another method for manufacturing multi-component targets not amenable to processing into ductile alloys, but nevertheless used in cathodic sputtering units. In the method of these patents, blind holes are made in the parent target material and the sputter target is provided with plugs which can be press-fitted into the blind holes. The same procedure can be followed if additional target materials are required. However, this method is comparatively expensive and, because of different thermal expansions of the individual components, the plugs can loose the secure fit, and hence loose the thermal and electrical conductivity required with the parent target. Moreover, given the local distances between the various materials that are to be sputtered, and given the generally dissimilar sputtering rates at different zones on the surface of a target, it is often impossible to assure that different components will be sputtered at rates which yield constant and acceptable concentration ratios required by the user.

SUMMARY OF THE INVENTION

Accordingly, it is an object of the present invention to provide a process for the manufacture of metallic sputter targets comprised of two or more metals, and optionally non-metals, wherein neither melting nor sinter-metallurgical techniques are needed or required. The metal sputter targets of the invention can be comprised of individual components which, when alloyed, would produce brittle materials that could neither be worked adequately, hot or cold, nor be machined, by, e.g., chip-forming methods, to the degree typically required for shaping a target.

According to the invention, neither the need for inserting plugs into the parent target nor the other disadvantages discussed above are needed.

The above objects are achieved by employing powdery materials, comprised of unalloyed individual components (sometimes containing ductile sub-alloys), and mixing the individual components to produce a powder mixture. The mixture is cold-pressed to form a shaped body which is then densified by repeated working, preferably by forge pressing, at temperatures below the lowest of melting point of the individual components and under material flow and cold welding conditions. The result is a dense target, in which the product continues to exist as a mixture of powders. The sputter target has the density and strength required of commercial sputter targets and is machinable.

The targets manufactured by the process of the present invention can take the form of homogeneously-bonded composite materials which generally have densities corresponding to about 96 to 100% of the theoretical values, and exhibit a metallic character, including: a metallic appearance, high mechanical strength, and good thermal and electrical conductivity. The process of the invention does not go so far as to induce true alloy formations or the development of intermetallic phases. While this is not certain and without wishing to be limited by any theory, perhaps some incipient alloy formation may occur at phase boundaries while the composite material is being worked, but it is believed that if this occurs it will only occur in isolated cases and will not influence the mechanical properties of the resulting product to any appreciable extent.

The multicomponent targets of the invention have the ductility properties of the individual ductile components. As a result, the process advantageously requires at least one major component to be ductile when cold, i.e., the material should not be brittle at the temperatures used for cold working, e.g., room temperature. Metals like the refractory metals, being ductile at elevated temperatures, but brittle at room temperature, if not treated respectively, should be treated by methods known to those skilled in the art, provided they have to be used as the ductile major component.

The process of the invention has proven to be particularly successful for manufacturing cathodic sputtering targets from aluminum, with lead, titanium and/or tantalum as the second metallic component. In these cases, the high ductility of the aluminum enables densities at or approaching 90% of the theoretical values expected to be obtained solely by cold-pressing, even before the material is worked.

Without wishing to be limited by any theory, it is believed that in contrast to hot-pressing, the process of the invention provides the above mentioned advantages by avoiding alloying materials which might form brittle alloys. Instead the components are worked under conditions such that while flow occurs, the components neither melt nor enter into alloy formation.

Hydraulic forging presses have proven to be effective for working these target materials, but success has also been obtained with other types of pressing, for example, by friction pressing with open, semi-open or closed dies.

The working treatment according to the invention, performed by forging, is rarely completed in one step, but is preferably completed in 3 to 8 steps, during which the material is subjected to a total deformation of at least about 30%, and preferably 50 to 70%.

By virtue of their high, unaltered ductility, the multicomponent metallic targets, worked as described above, are readily amenable to mechanical processing for producing desired target shapes, by processing methods which can include, for example, rolling to produce flat plates, or conventional chip-forming machining. In this way, not only is it possible to manufacture targets to desired shapes, ready for use in sputtering units, but it is also possible to produce sputter targets from materials which exhibit more advantageous mechanical properties. Moreover, the process according to the invention makes it possible to manufacture very much larger targets than heretofor suggested, and to manufacture such targets from particularly suitable materials.

DETAILED DESCRIPTION OF THE INVENTION

An aluminum/titanium target for cathodically sputtering these metals is prepared at an atomic ratio of 1:1. The two metallic components, in the form of powders, having an average particle size in the range of about 20 to 120 um, are introduced into an asymmetric-motion mixer, or positive mixer. The resulting powder mixture is introduced into a suitable pressing die, which is cold-pressed to form a green compact, with the pressure being applied by means of a hydraulic press. Because of the high ductility of the aluminum, the density of the green compact is approximately 94% of the theoretical value for that material, and already possesses sufficient mechanical strength to withstand handling during subsequent processing. The green blank, produced as above, is transferred into a forging press equipped with a semi-open die kept between 150° and 200° C. and is subjected to a five-pass final densification treatment, during which the individual components flow so that they are, in effect, kneaded into intimate contact with one another. Prior to starting the final densification treatment, and between each of the individual densification steps, the target material is held in a furnace, in which the temperature is progressively increased from 250° to 400° C. It is not necessary to protect the aluminum/titanium target material against oxidation, e.g., by canning, prior to the final densification treatment since the short working times and the relatively low working temperatures employed render anti-oxidation protection unnecessary. However, if desired, the materials can be so protected in this step.

After the mechanical densification treatment, the targets are mechanically processed into discs or rectangular plates, the former having an outside diameter of approximately 150 mm, while the latter measures approximately 500×100×6 mm.

A cathodic sputtering target, manufactured as described immediately above was installed in a magnetron-type industrial sputtering unit, which was sputtered at high material-removal rates, without manifesting the disadvantages that affect known targets of the same material composition.

Tests of the target, manufactured in accordance with the present invention compared with the same material composition, but manufactured by a hot-pressing technique, demonstrate the superiority of the process of the invention, this superiority manifesting itself in very pronounced increases in the density and mechanical strength of the target material.

What is claimed is:

1. Process for manufacturing a multicomponent metallic target for cathodic sputtering having at least one individual component which is ductile at room temperatures comprising:

mixing individual components into a powder mixture, each of said individual components being either unalloyed or a ductile alloy;

cold-pressing said powder mixture to form a shaped body;

densifying said shaped body by working in one or more steps at temperatures below the lowest of the melting points of the individual components and under material flow and cold welding conditions so that a dense sputter target having metallic characteristics is produced having individual components which continue to exist as a mixture of powders.

2. The process of claim 1 wherein said powder mixture is comprised of a mixture of metals and non-metals.

3. The process of claim 1 wherein each of said individual components is comprised of one or more materials which can form brittle alloys and/or if existing as an alloy exhibit brittle intermetallic phases.

4. The process of claim 1 wherein prior to being worked, the powder mixture cold-pressed to a shaped body is protected against oxidation.

5. The process of claim 1 wherein prior to being worked the powder mixture cold-pressed to a shaped body is canned in a protective envelope.

6. A cathodic sputtering target produced in accordance with the process of claim 1 having a density which corresponds to 96 to 100% of the theoretical value.

7. A cathodic sputtering target produced in accordance with the process of claim 1, comprising aluminum and at least one additional metal selected from the group consisting of lead, titanium and tantalum.

8. Process of claim 1 wherein at least one individual component is brittle.

9. Process of claim 1 wherein said individual components form a brittle composition when alloyed.

* * * * *